United States Patent [19]
Cameron et al.

[11] Patent Number: 6,048,672
[45] Date of Patent: Apr. 11, 2000

[54] PHOTORESIST COMPOSITIONS AND METHODS AND ARTICLES OF MANUFACTURE COMPRISING SAME

[75] Inventors: James F. Cameron, Boston; Martha M. Rajaratnam, Dedham; Roger F. Sinta, Woburn; James W. Thackeray, Braintree, all of Mass.

[73] Assignee: Shipley Company, L.L.C., Marlborough, Mass.

[21] Appl. No.: 09/027,127

[22] Filed: Feb. 20, 1998

[51] Int. Cl.$^7$ ........................................................ G03F 7/00
[52] U.S. Cl. ........................ 430/327; 430/313; 430/322; 134/1.3
[58] Field of Search ................................... 430/327, 330, 430/313, 322, 323; 134/1.3

[56] References Cited

U.S. PATENT DOCUMENTS

| | | | |
|---|---|---|---|
| 5,498,765 | 3/1996 | Carpenter et al. | 430/323 |
| 5,518,579 | 5/1996 | Katsuyama et al. | 156/659.11 |
| 5,558,976 | 9/1996 | Urano et al. | 430/326 |
| 5,731,364 | 3/1998 | Sinta et al. | 522/31 |
| 5,789,141 | 8/1998 | Usujima | 430/313 |

OTHER PUBLICATIONS

Dean et al., "Investigation of deep ultraviolet photoresists on TiN substrates", SPIE vol. 2438, pp. 514–528.

Kawai et al., "The Effect of an Organic Base in Chemically Amplified Resist on Patterning Characteristics Using KrF Lithography", Jpn. J. Appl. Phys., vol. 33 (1194), pp. 7023–7027.

Mori et al., "Substrate–Effect of Chemically Amplified Resist", Journal of Photopolymer Science and Technology, vol. 9, No. 4 (1996), pp. 601–610.

More et al., "Analysis of Substrate Effect in Chemically Amplified Resist on Silicate–Glass", Jpn. J. Appl. Phys., vol. 35 (1996), pp. 6495–6500.

Petersen et al., "Survey of Processing Affects on Substrate Compatibility of Chemically Amplified Resists", Journal of Photopolymer Science and Technology, vol. 8, No. 4 (1995), pp. 571–598.

Usujima et al., "Effects of Substrate Treatment in Positive Chemically–Amplified Resist", SPIE vol. 2438, pp. 529–539.

Yamanaka et al., "Investigation of Resist Pattern Deformation in Chemical Amplification Resists on $SiN_x$ Substrates", Jpn. J. Appl. Phys., vol. 34 (1995), pp. 6794–6799.

Yamanaka et al., "Roles of Surface Functional Groups in TiN and SiN Substrates in Resist Pattern Deformations", Jpn. J. Appl. Phys., vol. 36 (1997), pp. 7620–7624.

Primary Examiner—Kathleen Duda
Attorney, Agent, or Firm—S. Matthew Cairn; Peter F. Corless; Darryl P. Frickey

[57] ABSTRACT

The invention includes use of a positive chemically amplified photoresist composition that produces a strong photogenerated acid. The resist is coated onto a metal substrate that has been subjected to a stringent bake step, e.g. heating of the substrate at about at least 140° C. for more than 60 seconds. The combined use of strong photogenerated acid and stringent pre-coating substrate bake provides highly resolved resist relief images, including on metal substrates.

19 Claims, 1 Drawing Sheet

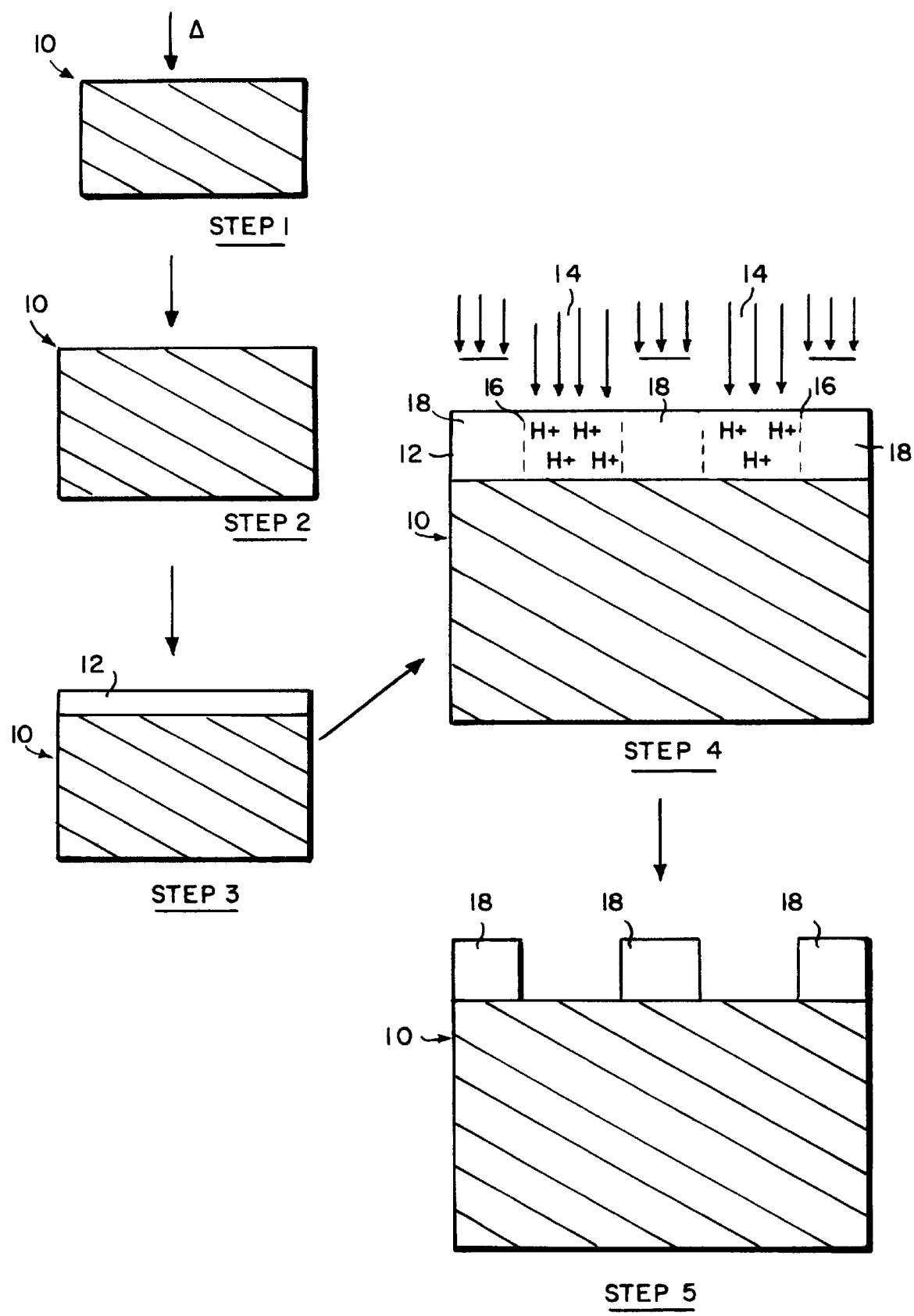

PHOTORESIST COMPOSITIONS AND METHODS AND ARTICLES OF MANUFACTURE COMPRISING SAME

BACKGROUND OF THE INVENTION

1. Field of the Invention

This invention relates to new photoresist compositions and methods that can provide significantly improved lithographic performance upon coating and imaging on metal substrates.

2. Background Art

Photoresists are photosensitive films for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque and transparent to activating radiation that define a desired image to be transferred to the underlying substrate. A relief image is provided by development of the latent image pattern in the resist coating. The use of photoresists is generally described, for example, by Deforest, Photoresist Materials and Processes, McGraw Hill Book Company, New York (1975), and by Moreau, Semiconductor Lithography, Principals, Practices and Materials, Plenum Press, New York (1988).

An important property of a photoresist is image resolution. A developed photoresist image of fine line definition, including lines of sub-micron and sub-half micron dimensions and having vertical or essentially vertical sidewalls is highly desirable to permit accurate transfer of circuit patterns to an underlying substrate. However, many current photoresists are not capable of providing such highly resolved fine line images.

More recently, certain "chemically amplified" photoresist compositions have been reported. Such photoresists may be negative-acting or positive-acting and rely on multiple crosslinking events (in the case of a negative-acting resist) or deprotection reactions (in the case of a positive-acting resist) per unit of photogenerated acid. In other words, the photogenerated acid acts catalytically. In the case of the positive chemically amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,851; 4,883,740; 4,810,613; and 4,491,628, and Canadian Patent Application 2,001,384. Upon selective cleavage of the blocking group through exposure of a coating layer of such a resist, a polar functional group is provided, e.g., carboxyl, phenol or imide, which results in different solubility characteristics in exposed and unexposed areas of the resist coating layer.

With the desire to produce high-density semiconductor devices, there is a movement in the industry to shorten the wavelength of exposure sources and use deep U.V. radiation. Such photoresists offer the potential of forming images of smaller features than may be possible at longer wavelength exposure. As is recognized by those in the art, "deep UV radiation" refers to exposure radiation having a wavelength in the range of 350 nm or less, more typically in the range of 300 nm or less such as radiation provided by a KrF excimer laser light (248 nm) or an ArF excimer laser light (193 nm).

However, a significant disadvantage with chemically-amplified resists is their frequent sensitivity to the environment as well as the underlying substrate, which can result in reduced resolution of the resist relief image. In particular, resolution problems often occur upon coating onto metal substrates such as TiN. For example, developed images of many current resists applied on TiN or other metal substrates often will exhibit "footing", i.e. where the resist fails to clear during development resulting in an upwardly tapering relief image sidewall. Deposition and processing of resists on metal substrates is required for many microelectronic device fabrications.

It thus would be desirable to have new photoresist compositions and methods that could provide highly resolved fine line images. It would be further desirable to have such new photoresist compositions and methods that provide highly resolved resist relief images upon coating and imaging on metal substrates such as TiN.

SUMMARY OF THE INVENTION

The invention provides new methods and positive-acting chemically-amplified photoresist compositions that can exhibit enhanced lithographic performance on metal substrates such as TiN.

The invention includes use of a positive chemically amplified photoresist composition that produces a strong (e.g. pKa of about 3 or less) photogenerated acid. The resist is coated onto a metal substrate that has been subjected to a stringent bake step, e.g. heating of the substrate at about at least 140° C. for more than 60 seconds.

We have found that combined use of a strong photogenerated acid and stringent pre-coating substrate bake can provide highly resolved resist relief images on metal substrates, including images with vertical sidewalls (no footing). See, for instance, the comparative data set forth in the examples which follow. In fact, apparent synergistic results are provided by the combined use of the stringent bake and strong photogenerated acid.

In more detail, the resists of the invention comprise 1) a photoacid generator compound that generates a strong acid upon irradiation, and 2) a component that undergoes a deblocking reaction in the presence of photogenerated acid.

A variety of photoacid generators that generate strong acids may be employed. Preferably, the 1photogenerated acid will have a pKa (as measured at 25° C. in water) of about 3 or less, more preferably a pKa of about 2 or 1.5 or less.

Preferred photogenerated acids include include sulfonic acids that are substituted with one or more electron withdrawing groups such as halogen, cyano, haloalkyl or nitro. Haolgen, particularly fluoro are generally preferred substituents of substituted sulfonic acids. Particularly suitable are perfluorosulfonic acids such as perfluoro($C_{1-15}$alkyl) sulfonic acid, e.g. trifluoromethanesulfonic acid (triflic acid), perfluorooctanesulfonic acid, perfluorohexanesulfonic acid, perfluoro(4-ethylcyclohexane)sulfonic acid, perfluorobutanesulfonic acid and the like.

Typically, the deblocking component will be the resin binder of the resist. The deblocking component may contain any of a variety of acid labile groups, such as acid sensitive esters, carbonates, acetals, ketals and the like, which suitably may be pendant from a polymer backbone. Acid labile groups that are integral to the polymer backbone also may be employed.

Further provided are methods for forming photoresist relief images and novel articles of manufacture comprising metal substrates that have been heat-treated and then coated with a photoresist composition in accordance with the invention. Other aspects of the invention are disclosed infra.

BRIEF DESCRIPTION OF THE DRAWINGS

FIG. 1 illustrates schematically a preferred method of the invention.

DETAILED DESCRIPTION OF THE INVENTION

In FIG. 1 of the drawings one preferred method of the invention is shown, although it should be appreciated that the invention is in no event limited to this depicted method.

In Step 1 of FIG. 1, metal substrate 10 is thermally treated prior to application of a photoresist composition. Metal substrate 10 may be a variety of dimensions and materials, generally depending on the intended use of the end product. At least a portion of an exposed surface of substrate 10 comprises a metal that may be suitably used in integrated circuit manufacture. For example, at least a portion of substrate 10 may be TiN (titanium nitride), SiON (silicon oxynitride), SiN(silicon nitride), BPSG (boron phosphorus silicate glass), TEOS and the like. Typically, the entire substrate surface being coated with resist and imaged will be metal.

As discussed above, thermal treatment conditions are stringent. More specifically, suitable conditions include heating of the substrate at about 135° C. to 140° C. or more, more preferably at about 145° C. or more, still more preferably at about 150° C., 160° C., 170° C. or 180° C. or more. Higher temperatures such as 190° C. or 200° C. may be employed if desired, although such temperatures are not required to obtain good results. The heat treatment is also conducted for a relatively extended time, e.g. preferably for at least about 30 seconds, more preferably 60 seconds or more, still more preferably 80, 90, 120, 150, 180, 240, 300 or 360 seconds or more. In general, thermal treatments at effective temperatures (e.g. from about 140° C. to 150° C. or more) for about 1–3 minutes will provide good results. Preferably, a photoresist composition will be applied to the thermally treated substrate (Step 3 in the Figure and discussed in detail below) shortly after completion of the heat treatment of this Step 1, e.g. within about 45 minutes after completion of the heat treatment, more preferably within about 30 minutes after completion of the heat treatment, still more preferably within about 15, 10 or 5 minutes after completion of the heat treatment.

Step 2 as shown in FIG. 1 includes generally optional procedures that are conducted prior to photoresist deposition, such as cooling of the heat-treated substrate, substrate priming e.g. with hexamethyldisilazane (HMDS) or other adhesion promoters, and the like.

In Step 3, the heated-treated substrate 10 is coated with a positive chemically-amplified photoresist formulation that contains a photoacid generator that produces a strong acid upon exposure to activating radiation. The photoresist can be applied by known methods such as spin coating and the like. After coating, the liquid resist layer is soft baked to remove solvent and provide resist coating 12 as depicted in FIG. 1. Exemplary conditions for such solvent removal include heating the coated substrate at a temperature of between about 70° C. and 150° C. for about one minute.

As discussed above, photoresists for use in the methods of the invention comprise 1) a photoacid generator compound that generates a strong acid upon irradiation, and 2) a component that undergoes a deblocking reaction in the presence of photogenerated acid.

Preferably, the photoacid generator produces upon irradiation an acid that has a pKa (as measured at 25° C. in water) of about 3 or less, more preferably about 2 or 1.5 or less, still more preferably photogenerated acids that have a pKa of no greater than 0, such as a pKa of from about −5 to −15.

Preferred photogenerated acids include substituted sulfonic acids, particularly halogenated sulfonic acids or sulfonic acids substituted with other electron withdrawing groups. Particularly suitable are alkyl sulfonic acids that are substituted with one or more electron withdrawing groups such as halogen, cyano, nitro, etc., with halogen, particularly fluoro, being especially preferred. The alkyl moiety suitably has from 1 to about 20 carbons, more typically 1 to about 16 carbon atoms, even more typically 1 to about 12 carbon atoms. Thus, preferred are halo($C_{1-15}$alkyl)sulfonic acid and halo($C_{1-10}$alkyl)sulfonic acid. Also, generally preferred are (substituted alkyl)sulfonic acids where the alkyl moiety is linear (i.e. straight chain). Perfluorosulfonic acids are in general most preferred.

Suitable photogenerated acids also include those of the following formula:

$$X_aRSO_3H$$

where R is an organic radical substituted with strong electron withdrawing groups X. R may be alkyl having from 1 to 18 carbon atoms, or aryl such as phenyl, benzyl, naphthyl, etc. Strong electron withdrawing groups that may be substituted onto R are exemplified by halo, nitro, cyano, haloalkyl such as fluoromethyl particularly trifluoromethyl, etc., preferably fluoro. The designation "a" represents the number of strong electron withdrawing groups substituted onto R and is a whole number preferably equal to 1 to 18, restricted of course by valences. Representative examples of photoacid generator compounds capable of generating acids conforming to the above generalized formula are given below.

A wide variety of photoacid generators that produce the strong acid can be employed, e.g. N-sulfonyloxyimides, onium salts, etc.

Thus, N-sulfonyloxyimide photoacid generators may be suitably used in the compositions of the invention, including those disclosed in International application WO94/10608, such as compounds of the following formula:

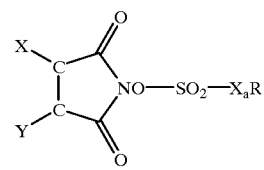

where the carbon atoms form a two carbon structure having a single, double or aromatic bond, or, alternatively, wherein they form a three carbon structure, that is, where the ring is instead a five member or six member ring; X and Y (1) form a cyclic or polycyclic ring which may contain one or more hetero atoms, or (2) form a fused aromatic ring, or (3) may be independently hydrogen, alkyl or aryl, or (4) may be attached to another sulfonyloxyimide containing residue, or (5) may be attached to a polymer chain or backbone, or alternatively, form

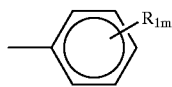

where $R_1$ is selected from the group consisting of H, acetyl, acetamido, alkyl having 1 to 4 carbons where m=1 to 3, $NO_2$ where m=1 to 2, F where m=1 to 5, Cl where m=1 to 2, $CF_3$ where m=1 to 2, and $OCH_3$ where m=1 to 2, and where m may otherwise be from 1 to 5, and combinations thereof, and where X and Y (1) form a cyclic or polycyclic ring which may contain one or more hetero atoms, (2) form a fused aromatic ring, (3) may be independently H, alkyl or aryl, (4) may be attached to another sulfonyloxyimide containing residue, or (5) may be attached to a polymeric chain or backbone.

Preferred photoacid generators include imidosulfonates of the following formula:

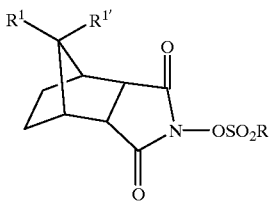

wherein each $R^1$ and $R^{1'}$ are each independently hydrogen or $C_{1-12}$ alkyl, more preferably hydrogen or methyl; and R is as defined above, i.e. alkyl (e.g. $C_{1-12}$ alkyl), camphor, adamantane and other cycloalkyl typically having from 5 to about 12 ring members, and perfluoroalkyl such as perfluoro($C_{1-12}$alkyl), particularly perfluorinated groups such as perfluorooctanesulfonate, perfluorobutanesulfonate and the like. A specifically preferred photoacid generator of this class is N-[(perfluorooctane sulfonyl)oxy]-5-norbornene-2,3-dicarboximide.

Examples of suitable onium salts include those that contain halogen complex anions of divalent to heptavalent metals or non-metals, for example, Sb, Sn, Fe, Bi, Al, Ga, In, Ti, Zr, Sc, D, Cr, Hf, and Cu as well as B, P, and As. Examples of suitable onium salts are diaryl-diazonium salts and onium salts of group Va and B, Ia and B and I of the Periodic Table, for example, halonium salts, quaternary ammonium, phosphonium and arsonium salts, aromatic sulfonium salts and sulfoxonium salts or selenium salts. Onium salts have been described in the literature such as in U.S. Pat. Nos. 4,442,197; 4,603,101; and 4,624,912.

Generally preferred are iodonium salt photoacid generators, such as those compounds disclosed in published European application 0 708 368 A1. Such salts include those represented by the following formula:

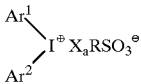

where $Ar^1$ and $Ar^2$ each independently represents a substituted or unsubstituted aryl group. A preferred example of the aryl group includes a $C_{6-14}$ monocyclic or a condensed ring aryl group. Preferred examples of the substituent on the aryl group include an alkyl group, a haloalkyl group, a cycloalkyl group, an aryl group, an alkoxy group, a nitro group, a carboxyl group, an alkoxycarbonyl group, a hydroxyl group, mercapto group, and a halogen atom.

Sulfonium salts are particularly suitable photoacid generators for resists of the invention, such as compounds of the following formula:

wherein $R^3$, $R^4$ and $R^5$ each independently represents a substituted or unsubstituted alkyl group or aryl group. With regard to each of the above formulae, preferred examples of the substituted or unsubstituted alkyl group and aryl group include a $C_{6-14}$ aryl group, a $C_{1-5}$ alkyl group, and substituted derivatives thereof. Preferred examples of the substituent on the alkyl group include a $C_{1-8}$ alkoxy group, a $C_{1-8}$ alkyl group, nitro group, carboxyl group, hydroxyl group, and a halogen atom. Preferred examples of the substituent on the aryl group include a $C_{1-8}$ alkoxy group, carboxyl group, an alkoxycarbonyl group, a $C_{1-8}$ haloalkyl group, a $C_{5-8}$ cycloalkyl group and a $C_{1-8}$ alkylthio group. Two of $R^3$, $R^4$ and $R^5$ and $Ar^1$ and $Ar^2$ may be connected to each other via its single bond or a substituent.

Another class of photoacid generators suitable for use in photoresists of the invention include those disclosed in U.S. Pat. No. 5,558,976. Representative examples of these photoacid generators include:

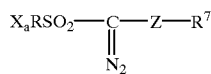

where $R^7$ is a straight-chain, branched or cyclic alkyl group having from 1 to 10 carbon atoms and Z is a sulfonyl group or a carbonyl group:

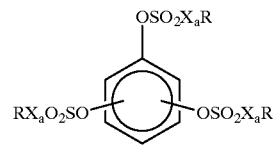

where R is as defined above; and

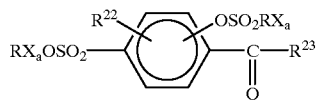

where $R^{22}$ is hydrogen, hydroxyl or a group represented by the formula $X_aRSO_2O$— where $X_aR$ is as defined above, and $R^{23}$ is a straight or branched alkyl group having from 1 to 5 carbon atoms or a group represented by the formula:

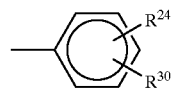

where $R^{24}$ and $R^{30}$ are independently a hydrogen atom, a halogen atom, a straight chain or branched alkyl group having 1–5 carbon atoms, a straight chain or branched alkoxy group having 1–5 carbon atoms, or a group of the formula:

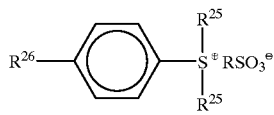

where $R^{25}$ is a straight chain or branched alkyl group having 1–4 carbon atoms, a phenyl group, a substituted phenyl group or an aralkyl group; $R^{26}$ is a hydrogen atom, a halogen atom or a straight-chain, branched or cyclic alkyl group having 1–6 carbon atoms; $R^{27}$ is a straight chain or branched perfluoroalkyl group having 1–8 carbon atoms, a straight chain, branched or cyclic alkyl group having 1–8 carbon atoms, a 1-naphthyl group, a 2-naphthyl group, a 10-camphor group, a phenyl group, a tolyl group, a 2,5-dichlorophenyl group, a 1,3,4-trichlorophenyl group or a trifluoromethylphenyl group.

Nitrobenzyl-based photoacid generators also may be employed, including those disclosed in EPO published application No. EP 0 717 319 A1. Suitable nitrobenzyl-based compounds include those of the following formula:

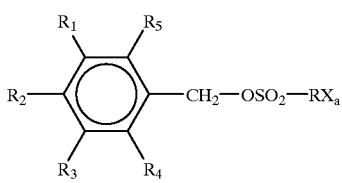

where each $R_1$, $R_2$ and $R_3$ are individually selected from the group consisting of hydrogen and lower alkyl group having from 1–4 carbon atoms; and $R_4$ and $R_5$ are individually selected from the group consisting of $CF_3$ and $NO_2$ and $RX_a$ is as defined above.

Disulfone derivatives are also suitable photoacid generators and are disclosed in published European application 0 708 368 A1. Such materials may be represented by the following formula:

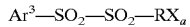

$Ar^3$—$SO_2$—$SO_2$—$RX_a$ wherein $RX_a$ is as defined above and $Ar^3$ represents a substituted or unsubstituted aryl group. A preferred example of the aryl group includes a $C_{6-14}$ monocyclic or condensed ring aryl group. Preferred examples of the substituent on the aryl group include an alkyl group, a haloalkyl group, a cycloalkyl group, an aryl group, an alkoxy group, nitro group, carboxyl group, an alkoxycarbonyl group, hydroxyl group, mercapto group, and halogen.

As discussed above, the deblocking component suitably will be a resin binder of the resist. The deblocking component may contain any of a variety of acid labile groups, such as acid sensitive esters, acetals, ketals and the like, which suitably may be pendant from a polymer backbone. Acid labile groups that are integral to the polymer backbone also may be employed. Preferred deblocking resin binders have also been disclosed in European Patent Published Application EP0813113A1 and European Patent Application 97115532 (corresponding to U.S. application Ser. No. 08/706,138), and in U.S. Pat. No. 5,258,257 to Sinta et al. Suitable deblocking resins and use of same in chemically amplified photoresists also have been described in U.S. Pat. Nos. 4,968,581; 4,883,740; 4,810,613; 4,491,628 and 5,492,793.

Preferred declocking resins for use in the resists of the invention include polymers that contain both phenolic and non-phenolic units. For example, one preferred group of such polymers has acid labile groups substantially, essentially or completely only on non-phenolic units of the polymer. One preferred polymer binder has repeating units x and y of the following formula:

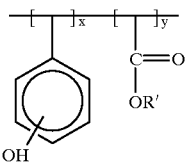

wherein the hydroxyl group be present at either the ortho, meta or para positions throughout the polymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The depicted phenolic units of the polymer also may be optionally substituted by such groups. The units x and y may be regularly alternating in the polymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C (=O)—, of the acrylate units serves as the acid labile groups of the resin and will undergo photoacid induced cleavage upon exposure of a coating layer of a photoresist containing the resin. Preferably the copolymer will have a Mw of from about 3,000 to about 50,000, more preferably about 10,000 to about 30,000 with a molecular weight distribution of about 3 or less, more preferably a molecular weight distribution of about 2 or less. Such copolymers also may be prepared by such free radical polymerization or other known procedures and suitably will have a Mw of from about 3,000 to about 50,000, and a molecular weight distribution of about 3 or less, more preferably a molecular weight distribution of about 2 or less.

Additional preferred deblocking resins have acid labile groups on both phenolic and non-phenolic units of the polymer. One preferred polymer binder has repeating units a, b and c of the following formula:

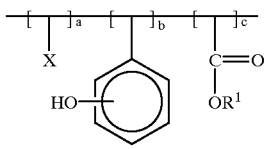

wherein R' group is a photoacid labile group as defined above for the other preferred polymer; and X is another repeat unit which may or may not contain a photoacid labile group. The values a, b and c designate the molar amount of the polymer units. Those polymer units may be regularly alternating in the polymer, or may be randomly interspersed through the polymer. Suitable X groups may be aliphatic or aromatic groups such as phenyl, cyclohexyl, adamantyl, isobornyl, optionally containing an acid labile group. Such polymers may be formed in the same manner as described for the polymer above, and wherein the formed copolymer is reacted to provide the phenolic acid labile groups.

Additional preferred deblocking resins include at least three distinct repeating units of 1) units that contain acid-labile groups; 2) units that are free of reactive groups as well as hydroxy groups; and 3) aromatic or other units that contribute to aqueous developability of a photoresist containing the polymer as a resin binder. Particularly preferred deblocking polymers of this type correspond to the following Formula I:

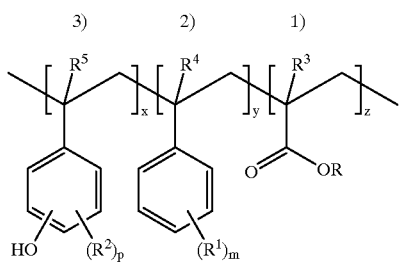

wherein R of units 1) is substituted or unsubstituted alkyl preferably having 1 to about 10 carbon atoms, more typically 1 to about 6 carbons. Branched alkyl such as tert-butyl are generally preferred R groups. Also, the polymer may comprise a mixture of different R groups, e.g., by using a variety of acrylate monomers during the polymer synthesis.

$R^1$ groups of units 2) of the above Formula I each independently may be e.g. halogen (particularly F, Cl and Br), substituted or unsubstituted alkyl preferably having 1 to about 8 carbons, substituted or unsubstituted alkoxy preferably having 1 to about 8 carbon atoms, substituted or unsubstituted alkenyl preferably having 2 to about 8 carbon atoms, substituted or unsubstituted alkynyl preferably having 2 to about 8 carbons, substituted or unsubstituted alkylthio preferably having 1 to about 8 carbons, cyano, nitro, etc.; and m is an integer of from 0 (where the phenyl ring is fully hydrogen-substituted) to 5, and preferably is 0, 1 or 2. Also, two $R^1$ groups on adjacent carbons may be taken together to form (with ring carbons to which they are attached) one, two or more fused aromatic or alicyclic rings having from 4 to about 8 ring members per ring. For example, two $R^1$ groups can be taken together to form (together with the depicted phenyl) a naphthyl or acenaphthyl ring. As with units 1), the polymer may comprise a mixture of different units 2) with differing $R^1$ groups or no $R^1$ groups (i.e. m=0) by using a variety of substituted or unsubstituted vinylphenyl monomers during the polymer synthesis.

$R^2$ groups of units 3) of the above Formula I each independently may be e.g. halogen (particularly F, Cl and Br), substituted or unsubstituted alkyl preferably having 1 to about 8 carbons, substituted or unsubstituted alkoxy preferably having 1 to about 8 carbon atoms, substituted or unsubstituted alkenyl preferably having 2 to about 8 carbon atoms, substituted or unsubstituted sulfonyl preferably having 1 to about to about 8 carbon atoms such as mesyl ($CH_3SO_2O$—), substituted or unsubstituted alkyl esters such as those represented by RCOO— where R is preferably an alkyl group preferably having 1 to about 10 carbon atoms, substituted or unsubstituted alkynyl preferably having 2 to about 8 carbons, substituted or unsubstituted alkylthio preferably having 1 to about 8 carbons, cyano, nitro, etc.; and p is an integer of from 0 (where the phenyl ring has a single hydroxy substituent) to 4, and preferably is 0, 1 or 2. Also, two $R^2$ groups on adjacent carbons may be taken together to form (with ring carbons to which they are attached) one, two or more fused aromatic or alicyclic rings having from 4 to about 8 ring members per ring. For example, two $R^2$ groups can be taken together to form (together with the phenol depicted in Formula I) a naphthyl or acenaphthyl ring. As with units 1), the polymer may comprise a mixture of different units 3) with differing $R^2$ groups or no $R^2$ groups (i.e. p=0) by using a variety of substituted or unsubstituted vinylphenyl monomers during the polymer synthesis. As shown in Formula I above, the hydroxyl group of units 3) may be either at the ortho, meta or para positions throughout the copolymer. Para or meta substitution is generally preferred.

Each $R^3$, $R^4$ and $R^5$ substituent independently may be hydrogen or substituted or unsubstituted alkyl preferably having 1 to about 8 carbon atoms, more typically 1 to about 6 carbons, or more preferably 1 to about 3 carbons.

The above-mentioned substituted groups (i.e. substituted groups R and $R^1$ through $R^5$ of Formula I above) may be substituted at one or more available positions by one or more suitable groups such as halogen (particularly F, Cl or Br); $C_{1-8}$ alkyl; $C_{1-8}$ alkoxy; $C_{2-8}$ alkenyl; $C_{2-8}$ alkynyl; aryl such as phenyl; alkanoyl such as a $C_{1-6}$ alkanoyl of acyl and the like; etc. Typically a substituted moiety is substituted at one, two or three available positions.

In the above Formula I, x, y and z are the mole fractions or percents of units 3), 2) and 1) respectively in the copolymer. These mole fractions may suitably vary over rather wide values, e.g., x may be suitably from about 10 to 90 percent, more preferably about 20 to 90 percent; y may be suitably from about 1 to 75 percent, more preferably about 2 to 60 percent; and z may be 1 to 75 percent, more preferably about 2 to 60 percent.

Preferred copolymers of the above Formula I include those where the only polymer units correspond to the general structures of units 1), 2) and 3) above and the sum of the mole percents x, y and z equals one hundred. However, preferred polymers also may comprise additional units wherein the sum of x, y and z would be less than one hundred, although preferably those units 1), 2) and 3) would still constitute a major portion of the copolymer, e.g. where the sum of x, y and z would be at least about 50 percent (i.e. at least 50 molar percent of the polymer consists of units 1), 2) and 3)), more preferably the sum of x, y and z is at least 70 percent, and still more preferably the sum of x, y and z is at least 80 or 90 percent. See European Published Patent Application EP 0813113A1 for detailed disclosure of free radical synthesis of copolymers of the above Formula I.

The photoresist composition of the invention preferably contains a strong base having a $pK_a$ of at least 9 and preferably a $pK_a$ within the range of from 11 to 15. A preferred base for the photoresist of the invention would conform to the formula $N(R')A_4$ where each R' is independently substituted or unsubstituted alkyl preferably having from 1 to about 12 carbon atoms, more typically 1 to about 8 carbon atoms, or a substituted or unsubstituted aryl such as a $C_{6-10}$ aryl, e.g. phenyl, naphthyl and the like, A is a counter anion of a halide, a substituted or unsubstituted hydroxyalkanoyl preferably having 1 to about 18 carbon atoms (i.e. a group substituted by hydroxy and carbonyl such as lactate —$CH_3CH(OH)C(=O)O^-$), substituted or unsubstituted sulfonate including a $C_{6-18}$ aryl or $C_{1-12}$ alkyl sulfonate. The term hydroxyalkanoyl as used herein refers to an alkanoyl group having one or more hydroxy moieties (typically 1, 2, 3 or 4 hydroxy moieties) on one or more carbons of the alkanoyl group. Exemplary sulfonate A groups include mesylate, triflate, tosylate, etc. Substituted A groups may be suitably substituted by one or more groups such as halo particularly fluoro, chloro and bromo, hydroxide, cyano, nitro, $C_{1-12}$ alkyl, $C_{2-12}$ alkyl, $C_{2-12}$ alkenyl, $C_{1-12}$ alkoxy, $C_{1-12}$ alkanoyl including acyl, etc. Additional amines can be found in U.S. Pat. No. 5,498,506 and SPIE, 2438, 551, 1995 and SPIE 2438, 563, 1995. Examples of suitable amines include ammonium sulfonate salts such as piperidinium p-toluenesulfonate and dicylohexylammonium p-tolunesulfonate; alkyl amines such as tripropylamine and dodecylamine; aryl amines such as diphenylamine, triphenylamine, aminophenol, 2-(4-aminophenyl)-2-(4-hyroxyphenyl) propane, etc.

The base can be added to the photoresist composition in a relatively small amount, for example, from about 0.01 to 5 percent by weight of the polymer and more preferably, from 0.05 to 1 percent by weight.

An optional component of the photoresist composition of the invention is a dye. Preferred dyes enhance resolution of the patterned resist image, typically by reducing reflections and the effects thereof (e.g. notching) caused by the exposure radiation. Preferred dyes include substituted and unsubstituted phenothiazine, phenoxazine, anthracene and anthrarobin compounds. Preferred substituents of substituted phenothiazine, phenoxazine, anthracene and anthrarobin include e.g. halogen, $C_{1-12}$ alkyl, $C_{1-12}$ alkoxy, $C_{2-12}$ alkenyl, $C_{1-12}$ alkanoyl such as acetyl, aryl such as phenyl, etc. Copolymers of such compounds also may be used as a dye, e.g., an anthracene acrylate polymer or copolymer. A curcumin dye also may be used for some applications. In addition to reducing reflections in deep U.V. exposures, use of a dye may expand the spectral response of the compositions of invention.

Photoresists of the invention also may contain other optional materials. For example, other optional additives include anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 30 percent by weight of the total weight of a resist's dry components.

The compositions of the invention can be readily prepared by those skilled in the art. For example, a photoresist composition of the invention can be prepared by dissolving the components of the photoresist in a suitable solvent such as, for example, a glycol ether exemplified by 2-methoxyethyl ether (diglyme), ethylene glycol monomethyl ether, propylene glycol monomethyl ether; a Cellosolve ester such as Cellosolve acetate, propylene glycol-monomethyl ether, methyl ethyl ketone, ethyl lactate, etc. Typically, the solids content of the composition varies between about 5 and 35 percent by weight of the total weight of the photoresist composition. The resin binder and PAG components should be present in amounts sufficient to provide a film coating layer and formation of good quality latent and relief images. See the examples which follow for exemplary preferred amounts of resist components.

Then, as depicted in Step 4 of the method shown in FIG. 1, the photoresist coating layer 12 is exposed to patterned activating radiation 14 to form a latent image in the dried coating layer comprising exposed areas 16 and unexposed areas 18. The exposure is sufficient to effectively activate the photoactive component, more specifically, the exposure energy typically ranges from about 1 to 300 mJ/cm$^2$, dependent upon the exposure tool and the components of the photoresist composition.

Coating layers of the resist compositions of the invention are suitably photoactivated by an exposure wavelength in the deep U.V. range i.e., 350 nm or less, more typically in the range of about 300 nm or less, typically about 150 to 300 or 350 nm. A particularly preferred exposure wavelength is about 248 nm.

Following exposure, the resist film layer is preferably baked at temperatures ranging from about 50° C. to about 160° C. to create or enhance solubility differences between exposed and unexposed regions of the resist layer As generally depicted in Step 5 in FIG. 1, after any such post-exposure bake, the film is developed, preferably using an aqueous-based developer such as an inorganic alkali exemplified by sodium hydroxide, potassium hydroxide, sodium carbonate, sodium bicarbonate, sodium silicate, sodium metasilicate; quaternary ammonium hydroxide solutions such as a tetra-alkyl ammonium hydroxide solution; various amine solutions such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with art recognized procedures.

Following development of the photoresist coating over the substrate, the developed substrate may be selectively processed on those areas bared of resist, for example by chemically etching or plating substrate areas bared of resist in accordance with procedures known in the art. For example, for the manufacture of microelectronic substrates, suitable etchants include a plasma gas etch (e.g. an oxygen plasma etch) and a hydrofluoric acid etching solution. After such processing, resist may be removed from the processed substrate using known stripping procedures.

All documents mentioned herein are incorporated herein in their entirety by reference. The following non-limiting examples are illustrative of the invention.

EXAMPLES 1–3

Preparation of Preferred Photoacid Generators

EXAMPLE 1

Preparation of Di-(4-t-butylphenyl)iodonium perfluorooctanesulfonate

A 1 L 3 neck round bottom flask equipped was charged t-butylbenzene (134.22 g, 1.00 mol) and acetic anhydride (204.18 g, 2.00 mol). The flask was fitted with an efficient overhead paddle stirrer and the stirrer started while potassium iodate (107.00 g, 0.50 mol) was added to give a white suspension. The reaction vessel was then equipped with a thermometer and a pressure equalizing dropping funnel (125 mL) fitted with a N$_2$ bubbler. The reaction mixture was cooled to 0–5° C. in a large ice-water bath and concentrated sulfuric acid (107.89 g, 1.10 mol) added dropwise via the addition funnel.

The addition was carried out at such a rate as to maintain the reaction temperature in the 20–30° C. range and required around 2 hours. Once the addition was over, the reaction mixture was stirred at water bath temperature (20° C.) for a further 22 h. The reaction mixture was cooled to 5–10° C. and water (350 mL) was added dropwise over @ 30 min, maintaining the temperature below 30° C.

The resulting cloudy mixture was washed with hexane (3×75 mL) and the aqueous solution of diaryliodonium salt was returned to the reaction flask and cooled to 15–20° C. in an ice water bath. Perfluorooctanesulfonic acid, potassium salt (269.11 g, 0.50 mol) was added in one portion with stirring. The resulting cloudy reaction mixture was neutralized with ammonium hydroxide (14.8N, 277 mL, 4.10 mol). The addition of the base was carried out at such a rate as to keep the temperature below 30° C. and required about 2 h. As the pH of the reaction mixture approached 6–7, a brown gummy solid starts to precipitate from solution. At this point, addition of ammonium hydroxide is temporarily stopped and dichloromethane (300 mL) is added to give a biphasic mixture. After stirring for 3 h, the dichloromethane layer was drained off and the aqueous layer extracted with additional dichloromethane (2×100 mL).

The combined dichloromethane extracts was washed with dilute ammonium hydroxide until the pH of the aqueous layer is in the 7–8 range [1×100 mL, the pH of the aqueous solution was adjusted to 8–9 by adding sufficient ammonium hydroxide (14.8N) in small portions]. The organic layer was washed with water (2×100 mL) until the pH of the aqueous phase was around 6–7. The dichloromethane solution was concentrated on a rotary evaporator under water aspirator vacuum. The resulting residue is then purified by successive recrystallizations from ethyl acetate-cyclohexane. The resulting white solid was dried at 70° C. in vacuum for 36 h, to give di-(4-t-butylphenyl)iodonium perfluorooctanesulfonate as a white powder.

EXAMPLE 2

Preparation of Triarylsulfonium Perfluorooctanesulfonate

To a suspension of perfluorooctanesulfonic acid potassium salt (10.76 g, 20.0 mmol) in water (100 mL) at room temperature under nitrogen was added dropwise triphenylsulfonium bromide (6.87 g, 20.0 mmol) over 15 min. After stirring the suspension for 30 min., dichloromethane (100 mL) was added and the biphasic mixture stirred at room temperature for 20 h. Additional dichloromethane (100 mL) was added and the layers separated. The organic layer was washed with water (3×75 mL) until the washings were neutral (pH 7). After drying (MgSO$_4$), removal of the solvent in vacuum gave a viscous gum which was further dried by heating at 50° C. for 24 h under vacuum. In this way, triphenylsulfonium perfluorooctanesulfonate was isolated as a pale yellow gummy solid.

EXAMPLE 3

Preparation of N-[(perfluorooctanesulfonyl)oxy]-5-norbornene-2,3-dicarboximide A 500 ml 3 neck flask was charged with N-hydroxy-5-norbornene-2,3-dicarboximide (22.39 g, 0.125 mol). The flask was fitted with a condenser, a dropping funnel, a nitrogen bubbler and a magnetic stirrer. 1,1,1,3,3,3-Hexamethyldisilazane (14.50 ml, 11.10 g, 68.75 mmol) was added via the dropping funnel followed by one drop of chlorotrimethylsilane as catalyst. The suspension was brought to a gentle reflux and heated thereat for 3 h. The resulting solution solidified upon cooling to room temperature. This solid was presumed to be the corresponding N-OTMS ether. 1,2-Dimethoxyethane (75 ml) was added followed by perfluorooctanesulfonyl fluoride (37.85 ml, 69.04 g, 0.1375 mol) and the resulting biphasic mixture heated to reflux. A solution of triethylamine (3.48 ml, 2.53 g, 25.0 mmol) in 1,2-dimethoxyethane (25 ml) was added to the hot solution and the mixture turned pale orange. The reaction mixture was heated at reflux for 64 h to give a dark brown-black solution. At this stage, TLC showed the presence of the desired product and confirmed complete consumption of the starting alcohol. The reaction mixture was transferred to a 500 ml single neck flask and concentrated in vacuo to give a tan semi-solid which solidified on cooling to room temperature. The crude product (82.10 g) was suspended in hot methanol (200 ml) and heated to dissolve the solid. The resulting solution was cooled to room temperature and on standing for 6 h, a significant amount of crystals were deposited. The crystals were collected by suction filtration, rinsed with ice cold methanol (2×25 ml) and dried in vacuo and temperature for 18 h to give 28.03 g of material. The mother liquor was reduced to half its original volume and cooled in an ice bath to deposit additional solid. The second crystal crop was isolated as described above to give an additional 6.81 g of material. The two crystal crops were combined and purified by dry flash column chromatography using Flash grade silica gel using 50% dichloromethane/50% haxane as eluant. The material was further purified by recrystallization from hexanes. After drying at 50 C. for 24 h, N-[(perfluorooctanesulfonyl)oxy]-5-norbornene-2,3-dicarboximide was isolated as a white crystalline solid.

EXAMPLES 4–11

Resist Preparation and Processing

EXAMPLE 4

Comparative (Non-Invention) Processing

A control (comparative) resist formulation comprising a copolymer of 4-hydroxystyrene and t-butylacrylate (30 g of a 20 wt. % solution in ethyl lactate), di-(4-t-butylphenyl) iodonium camphorsulfonate (DTBPIOCS) (0.24 g), a stabilizing additive (0.133 g of a 10 wt. % solution in ethyl lactate), Silwet™ L-7604 (0.156 g of a 5 wt. % solution in ethyl lactate) and ethyl lactate (4.385 g) was prepared. TiN substrates were subjected to a dehydration bake on a GCA 1006 track at 140° C. for 120 seconds cooled and HMDS oven primed at 90° C. The TiN substrates were coated with this resist to a thickness of 9850 Å and soft baked at 140° C. for 60 seconds on a vacuum hot plate using a TEL track coat and bake system. A Prometrix SM300 film thickness measurement tool was used for film thickness measurements. Coated wafers were then exposed on a GCA XLS 7800 excimer laser stepper fitted with a reticle consisting of blank quartz or dense line/space pairs and isolated lines. Exposed wafers were then post-exposure baked at 130° C. for 90 seconds and developed with a 45 second single spray puddle on a TEL track system using Shipley Microposit LDD-26W 0.26N tetramethylammonium hydroxide developer. The results of this evaluation indicated this resist showed significant footing at the resist substrate interface of 0.25 um isolated and nested features. See Table I for measured footing sizes. Table I follows Example 11 below.

EXAMPLE 5

A resist formulation comprising a copolymer of 4-hydroxystyrene and t-butylacrylate (30 g of a 20 wt. % solution in ehtyl lactate), di-(4-t-butylphenyl) iodoniumperfluorooctanesulfonate (DTBPIOPFOS) (0.24 g), a stabilizing additive (0.133 g of a 10 wt. % solution in ethyl lactate). Silwet™ L-7604 (0.156 g of a 5 wt. % solution in ethyl lactate) and ethyl lactate (4.385 g) was prepared. TiN substrates were subjected to a dehydration bake on a GCA 1006 track at 140° C. for 120 seconds cooled and HMDS oven primed at 90° C. The TiN substrates were imaged as described above. The results of this evaluation indicated this resist showed reduced footing at the resist substrate interface of 0.25 um isolated and nested features. See Table I for measured footing sizes. Table I follows Example 11 below.

EXAMPLE 6

Using the same resist formulation and TiN substates as in Example 4 and increasing the dehydration bake temperature to 150° C. for 120 seconds. The results of this evaluation indicated this resist showed no footing at the resist substrate interface of 0.25 um isolated and nested features.

EXAMPLE 7

A resist formulation comprising a copolymer of 4-hydroxystyrene and t-butylacrylate (30 g of a 20 wt. % solution in ethyl lactate), di-(4-t-butylphenyl)iodonium perfluorohexanesulfonate (DTBPIOPFHS) (0.24 g), a stabilizing additive (0.133 g of a 10 wt. % solution in ethyl lactate), Silwet™ L-7604 (0.156 g of a 5 wt. % solution in ethyl lactate) and ethyl lactate (4.385 g) was prepared. TiN substrates were subjected to a dehydration bake on a GCA 1006 track at 140° C. for 120 seconds cooled and HMDS oven primed at 90° C. The TiN substrates were imaged as described above. The results of this evaluation indicated this resist showed reduced footing at the resist substrate interface of 0.25 $\mu$m isolated and nested features.

EXAMPLE 8

Using the same resist formulation and TiN substrates as in Example 7 above and increasing the dehydration bake temperature to 150° C. for 120 seconds. The results of this evaluation indicated this resist showed no footing at the resist substrate interface of 0.25 $\mu$m isolated and nested features.

EXAMPLE 9

A resist formulation comprising a terpolymer of 4-hydroxystyrene, styrene and t-butylacrylate (30 g of 20 wt. % solution in ethyl lactate), di-(4-t-butylphenyl)iodonium perfluorooctanesulfonate (DTBPIOPFOS) (0.428 g), a stabilizing additive (0.257 g of a 10 wt % solution in ethyl lactate), Silwet™ L-7604 (0.161 g of a 5 wt. % solution in ethyl lactate) and ethyl lactate (5.189 g) was prepared. TiN substrates were subjected to a dehydration bake on a GCA 1006 track at 140° C. for 120 seconds cooled and HMDS oven primed at 90° C. The TiN substrates were imaged as described above. The results of this evaluation indicated this resist showed greatly reduced footing at the resist substrate interface of 0.25 $\mu$m isolated and nested features. See Table I for measured footing sizes. Table I follows Example 11below.

EXAMPLE 10

Using the same resist formulation and TiN substrates as in Example 9 and increasing the dehydration bake temperature to 150° C. for 120 seconds. The results of this evaluation indicated this resist showed no footing at the resist substrate interface of 0.25 $\mu$m isolated and nested features.

EXAMPLE 11

A resist composed of partially hydrogenated poly(4-hydroxy)styrene modified with t-butylacetate moieties (50 g of a 24 wt. % solution in ethyl lactate), di-(4-t-butylphenyl) iodonium perfluorooctanesulfonate (DTBPIOPFOS) (0.600 g), Silwet™ L-7604 (0.315 g of a 5 wt. % solution in ethyl lactate) and ethyl lactate (19.435 g) was prepared. TiN substrates were HMDS oven primed at 90° C. The TiN substrates were imaged as described above. The results of this evaluation indicated this resist showed reduced footing at the resist substrate interface of 0.35 $\mu$m isolated and nested features.

TABLE I

| Example No. | Measured Foot Size (nm) |
|---|---|
| 4 | 42 |
| 5 | 21 |
| 9 | 13 |

For those formulations which showed improved performance upon dehydration bake on a GCA 1006 track, similar improved results could also be obtained employing a Tel track coat and bake system and a dehydration bake at 150° C. for 120 seconds followed by a HMDS track prime at 120° C. for 30 seconds.

The foregoing description of the invention is merely illustrative thereof, and it is understood that variations and modifications thereof can be made without departing from the spirit or scope of the invention as set forth in the following claims.

What is claimed is:

1. A method for forming a photoresist relief image onto a substrate having a TiN surface area, comprising:
   a) heating at a temperature of from 135° C. to 180° C. a substrate having TiN exposed on at least a portion of the substrate surface;
   b) after heating the substrate, applying a coating layer of a positive chemically-amplified photoresist composition onto the substrate, the photoresist composition comprising 1) a photoacid generator that produces upon exposure to activating radiation a sulfonic acid substituted with one or more electron withdrawing groups, and 2) a component that comprises moieties that are labile in the presence of the substituted sulfonic acid; and
   c) exposing and developing the photoresist composition coating layer to provide a photoresist relief image.

2. The method of claim 1 wherein the sulfonic acid is substituted by halogen, cyano, haloalkyl or nitro.

3. The method of claim 1 wherein the sulfonic acid is halogen-substituted.

4. The method of claim 1 wherein the sulfonic acid is fluoro-substituted.

5. The method of claim 1 wherein the sulfonic acid is a perfluorinated sulfonic acid.

6. The method of claim 5 wherein the perfluorinated sulfonic acid has from 1 to about 12 carbon atoms.

7. The method of claim 1 wherein the acid is triflic acid, perfluorohexanesulfonic acid, perfluorooctanesulfonate, perfluorobutanesulfonate, or perfluoro(4-ethylcyclohexane) sulfonic acid.

8. The method of claim 1 wherein the substrate is heated at a temperature of at least about 140° C.

9. The method of claim 1 wherein the substrate is heated at a temperature of at least about 150° C.

10. The method of claim 1 where in the photoacid labile component is a resin binder of the photoresist composition.

11. A method for forming a photoresist relief image onto a substrate having a TiN surface area, comprising:

a) heating at a temperature of from 135° C. to 180° C. a substrate having TiN on at least a portion of the exposed substrate surface;

b) after heating the substrate, applying a coating layer of a positive chemically-amplified photoresist composition onto the substrate, the photoresist composition comprising 1) a photoacid generator that produces upon exposure to activating radiation an acid having a pKa of 3 or less, and 2) a component that comprises moieties that are labile in the presence of the acid; and c) exposing and developing the photoresist composition coating layer to provide a photoresist relief image.

12. The method of claim 11 wherein the pKa of the acid does not exceed 0.

13. The method of claim 11 wherein the acid is a substituted sulfonic acid.

14. The method of claim 11 wherein the acid is of the following formula:

$$X_aRSO_3H$$

where R is an organic radial having from 1 to about 18 carbon atoms, each X is the same or different and an electron withdrawing group and a is a whole number.

15. The method of claim 14 wherein each X is halogen, nitro or cyano.

16. The method of claim 14 wherein each X is fluoro.

17. The method of claim 11 wherein the substrate is heated at a temperature of at least about 140° C.

18. The method of claim 11 wherein the substrate is heated at a temperature of at least about 150° C.

19. The method of claim 11 wherein the photoacid labile component is a resin binder of the photoresist composition.

* * * * *